US007078268B1

(12) United States Patent
Geosling

(10) Patent No.: US 7,078,268 B1
(45) Date of Patent: Jul. 18, 2006

(54) METHOD OF FABRICATING A VACUUM SEALED MICRODEVICE PACKAGE WITH GETTERS

(75) Inventor: Christine Geosling, Calabasas, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/366,088

(22) Filed: Mar. 2, 2006

Related U.S. Application Data

(62) Division of application No. 10/797,322, filed on Mar. 9, 2004, now Pat. No. 7,042,076.

(51) Int. Cl.
*H01L 21/44* (2006.01)
*H01L 21/48* (2006.01)
*H01L 21/50* (2006.01)

(52) U.S. Cl. .............................. 438/115; 257/E21.499

(58) Field of Classification Search ..................... None
See application file for complete search history.

(56) References Cited

U.S. PATENT DOCUMENTS

| | | | |
|---|---|---|---|
| 4,426,769 | A | 1/1984 | Grabbe |
| 4,515,668 | A | 5/1985 | Brownell et al. |
| 4,630,095 | A | 12/1986 | Otsuka et al. |
| 5,293,511 | A | 3/1994 | Poradish et al. |
| 5,610,438 | A | 3/1997 | Wallace et al. |
| 5,921,461 | A | 7/1999 | Kennedy et al. |
| 5,929,515 | A | 7/1999 | Greiff et al. |
| 6,110,808 | A | 8/2000 | Saito |
| 6,423,575 | B1 | 7/2002 | Tran et al. |
| 6,534,850 | B1 | 3/2003 | Liebeskind |
| 2003/0132514 | A1 | 7/2003 | Liebeskind |

FOREIGN PATENT DOCUMENTS

| | | |
|---|---|---|
| WO | WO 02/42716 | 5/2002 |

*Primary Examiner*—David A. Zarneke

(57) ABSTRACT

One embodiment of the invention relates to a microdevice package containing getters for maintaining a constant vacuum level within the sealed microdevice package. A stacked wafer assembly, containing a plurality of microdevice packages, is formed by aligning a bottom cover wafer with a center wafer. The bottom cover wafer includes one or more bond pads to receive one or more getters. The center wafer includes one or more vias substantially aligned and corresponding to the one or more bond pads. One or more getters are inserted into the one or more vias. The stacked wafer assembly is completed by aligning a top cover wafer opposite the bottom cover wafer to sandwich the center wafer in between. A constant vacuum level is maintained inside the microdevice packages by aligning the wafers, activating the getters, and sealing the microdevice packages in a given sequence.

21 Claims, 3 Drawing Sheets

METHOD OF FABRICATING A VACUUM SEALED MICRODEVICE PACKAGE WITH GETTERS

CROSS REFERENCE TO RELATED APPLICATIONS

This application is a divisional of application Ser. No. 10/797,322 filed Mar. 9, 2004 now U.S. Pat. No. 7,042,076 for Vacuum Sealed Microdevice Packaging With Getters.

BACKGROUND OF THE INVENTION

1. Field of the Invention

Various embodiments of the invention pertain to sealed chip packaging. More particularly, one embodiment of the invention pertains to a system, device, and method for incorporating getters into hermetically sealed silicon microdevices, in particular silicon gyroscope chips.

2. Description of Related Art

Certain silicon microdevices, such as vibratory gyroscopic rate sensors, typically require very low gas damping (high Q) to operate. This is often accomplished by operating the device in a vacuum, reducing gas damping to a low level. At the present, devices required to be operated in vacuum are typically mounted in packages that can then be sealed in vacuum. It is also important to maintain that same low pressure over the operating period of the gyroscope, since a change in pressure over time can cause performance errors. Silicon microdevices can be made and sealed hermetically. This is usually accomplished at the wafer level by such methods as silicon direct bonding, anodic bonding, metal sealing, glass frit bonding, or polymeric adhesion. In most applications for wafer level packaging or encapsulation, microdevices are sealed at atmosphere pressure. Although microdevice cavities can be sealed in this fashion in vacuum, the vacuum level quickly degrades due to outgassing, permeation, and/or virtual leaks.

Incorporation of one or more active getters within the cavities of a microdevice chip serves to stabilize the vacuum level, as gasses are constantly sorbed to create a steady state pressure. To incorporate a gettering capacity within a cavity, a getter must be activated or fired (depending on the type) at high temperatures, usually at or higher than about 400° C. This must be done in vacuum or an inert gas (e.g., helium, neon, argon, etc.) and in situ immediately prior to sealing, or the getter loses its capacity due to re-sorption of active gasses (hydrogen, oxygen, nitrogen, etc.). Thus, to incorporate getters into cavities defined by bonding silicon wafers together, the getters must be positioned in the cavities before the bonding process. They must then be activated within a bonding chamber that includes vacuum and a bonding mechanization to bring wafers together to form the bond. The bonding process can include parameters such as pressure, heat, electrical current, or any other parameter that would normally be used to bond wafers with the selected technique.

An additional requirement for fabrication of certain microdevices, such as a silicon gyroscope chips, is that the wafers be precisely aligned, to within several microns or less, at the time of bonding. In effect, this requires that getters be inserted into a first wafer or wafer assembly prior to alignment of a second wafer or wafer assembly so as to effect and maintain the required level of alignment precision throughout the bonding process.

Typically, fabrication of such microdevices also requires the stable positioning and bonding of the getter itself to the interior of the cavity. Securing the getters to the interior cavity prevents the getters from moving within the cavity during operation and interfering with device motion or electrical integrity.

Another common requirement for fabrication of such microdevices is the application of a high vacuum, with pumping, during the getter activation time and immediately thereafter until the wafers are brought together and sealed.

SUMMARY OF THE INVENTION

One embodiment of the invention relates to a microdevice package containing getters for maintaining a constant vacuum level within the sealed microdevice package. A stacked wafer assembly, containing a plurality of microdevice packages, is formed by aligning a bottom cover wafer with a center wafer. The bottom cover wafer includes one or more bond pads to receive one or more getters. The center wafer includes one or more vias substantially aligned and corresponding to the one or more bond pads. One or more getters are inserted into the one or more vias. The stacked wafer assembly is completed by aligning a top cover wafer opposite the bottom cover wafer to sandwich the center wafer in between.

A constant vacuum level is maintained inside the microdevice packages by aligning the wafers, activating the getters, and sealing the microdevice packages in a given sequence. The bottom cover wafer and the center wafer are aligned. Getters are then inserted in the vias of the center wafer. In one alternative implementation, the bottom cover wafer is bonded to the center wafer prior to inserting the one or more getters into the one or more vias. The bottom cover wafer and the top cover wafer are then aligned.

The wafer stack assembly is placed in a vacuum chamber for bonding and getter activation. The wafer stack assembly is heated in a vacuum to a temperature sufficient to re-flow solder on the one or more bond pads. The wafer stack assembly is then cooled to solidify the solder and secure the one or more getters to their corresponding bond pads. The vacuum chamber is then purge of air and contaminants and, optionally, a non-gettable gas is inserted into the vacuum chamber. The getters are then heated to an activation temperature that is less than the solder re-flow temperature. The vacuum chamber is pumped to achieve a desired vacuum level. The bottom cover wafer, center wafer, and top cover wafer are then bonded to form a sealed package having a substantially constant vacuum therein.

DETAILED DESCRIPTION

Methods and systems that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment. Throughout the drawings, reference numbers are re-used to indicate correspondence between referenced elements. In addition, the first digit of each reference number indicates the figure in which the element first appears.

In the following description, certain terminology is used to describe certain features of one or more embodiments of the invention. For instance, the term "microdevice" includes any electronic, electromechanical, mechanical, and/or storage device that may be mounted within a chip package.

One embodiment of the invention provides a method and system for incorporating one or more getters into hermetically sealed silicon microdevices, such as silicon gyroscope chips. As a result of the incorporating such getters into a microdevice chip, a constant vacuum level is established and maintained within the microdevice chip.

Figure 1:
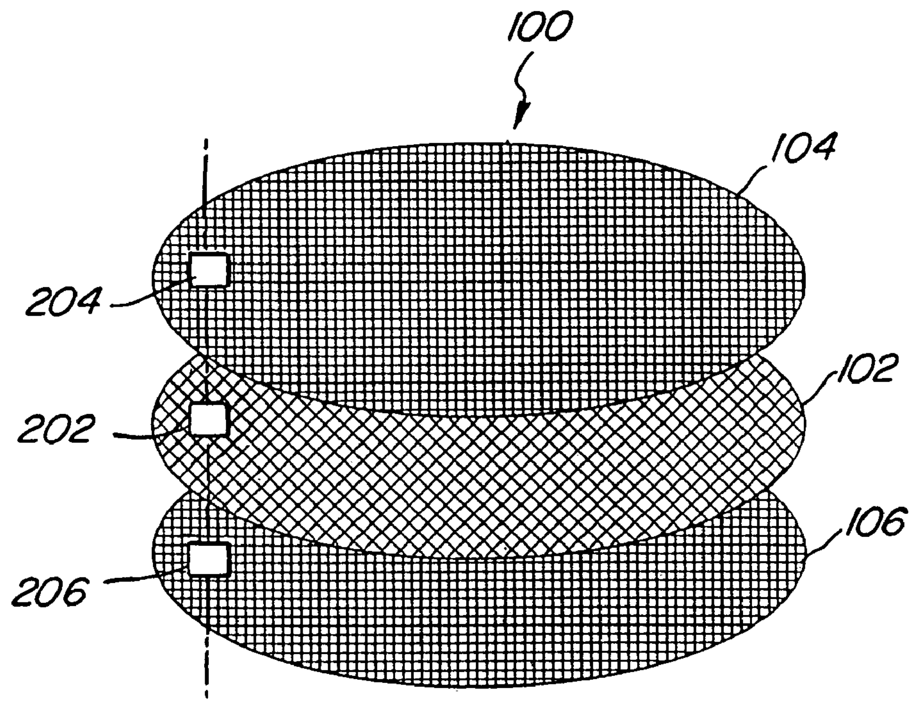
FIG. 1 illustrates a wafer assembly in which a center wafer is sandwiched between a top cover wafer and a bottom cover wafer according to one embodiment of the invention

FIG. 1 illustrates a wafer assembly 100 in which a center wafer 102 is sandwiched between a top cover wafer 104 and a bottom cover wafer 106 according to one embodiment of the invention. The surfaces of the top and bottom cover wafers 104 and 106 that face the center wafer 102 are referred to as the "microdevice side" or "inner" surfaces of the wafers. The surfaces of the top and bottom wafers 104 and 106 opposite the "inner" surfaces are referred to as the "outer" surfaces of the wafers. The stacked wafer assembly 100 may include one or more microdevice chips. Each microdevice chip in the stacked wafer assembly 100 may include one or more getters to maintain a constant vacuum level inside the microdevice chip.

In one embodiment of the invention, the wafers 102, 104, and 106 are bonded in a vacuum bonder, and they are aligned in a wafer bond aligner. Alignment may be accomplished with a fixture/chuck assembly which employs "flags" to keep wafers separate and aligned between alignment in a precision bond aligner and bonding in a vacuum bonder.

The top and bottom cover wafers 104 and 106 are fabricated to contain microdevice chip covers (FIGS. 2, 204 and 206) with one or more recessed areas. The center wafer 102 is fabricated to contain microdevice chip center layers (FIG. 2, 202) with one or more through-etched vias to accommodate one or more getters and provide a gettering pathway for getterable gasses. The top and bottom cover wafers 104 and 106 may be formed of a material such as silicon.

Figure 2:
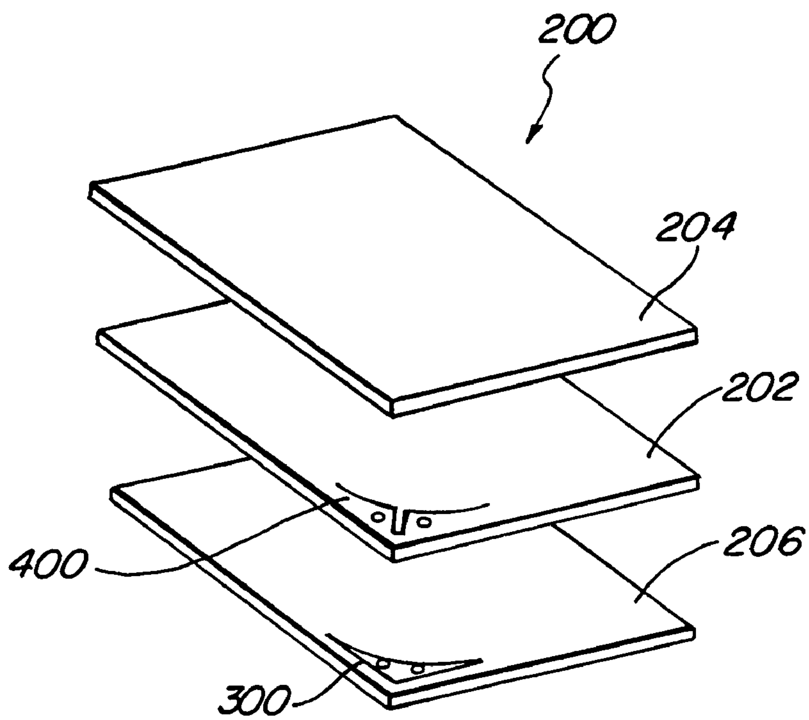
FIG. 2 illustrates a microdevice chip that may be formed in a stacked wafer assembly according to one embodiment of the invention.

FIG. 2 illustrates a microdevice chip 200 that may be formed in the stacked wafer assembly 100 according to one embodiment of the invention. The microdevice chip 200 includes a center layer 202 a top cover layer 204 and a bottom cover layer 206. The center layer 202 may be one of a plurality of microdevice chip center layers found in the center wafer 102 illustrated in FIG. 1. Similarly, the top and bottom cover layers 204 and 206 may be one of a plurality of microdevice chip cover layers found in the top and bottom cover wafers 104 and 106, respectively. The wafers 102, 104, and 106 may be designed and positioned such that the microdevice layers (e.g., center layer 202 and cover layers 204 and 206) align with each other to form one or more microdevice chips 200.

Figure 3:
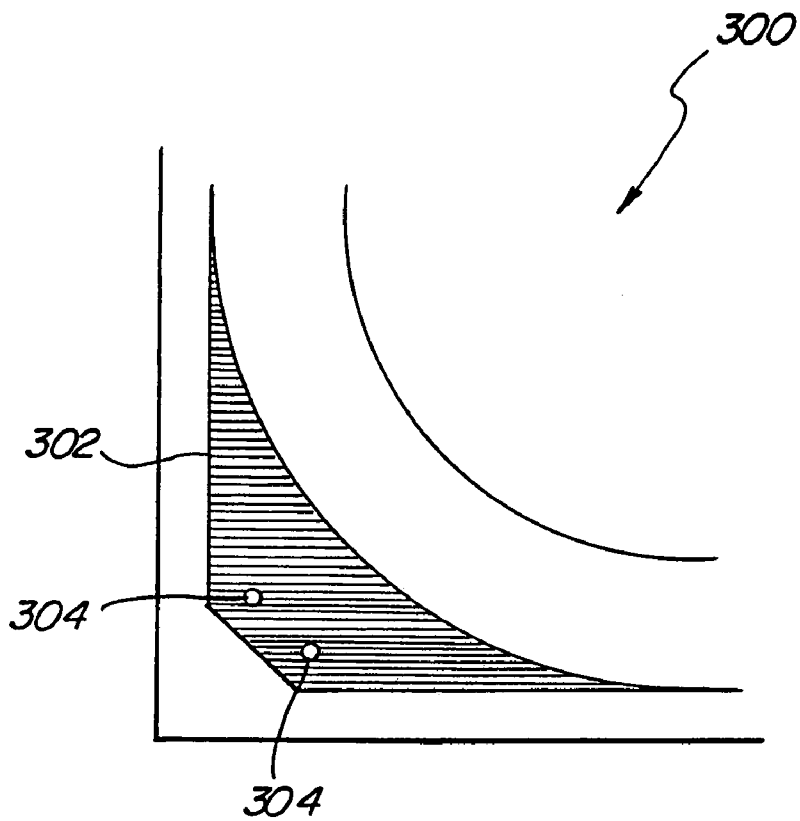
FIG. 3 illustrates a corner portion of a microdevice chip bottom cover layer according to one embodiment of the invention.

FIG. 3 illustrates a corner portion of a microdevice chip bottom cover layer 300, similar to bottom cover layer 206 in FIG. 2, according to one embodiment of the invention. The microdevice side or inner surface of the bottom cover layer 300 may include a recessed area 302 with one or more bond or solder pads 304 deposited on the bottom to bond one or more getters during a solder re-flow process. Depending on the application, the solder pads 304 may include such metals as chromium (Cr), nickel (Ni), and/or gold (Au).

Figure 4:
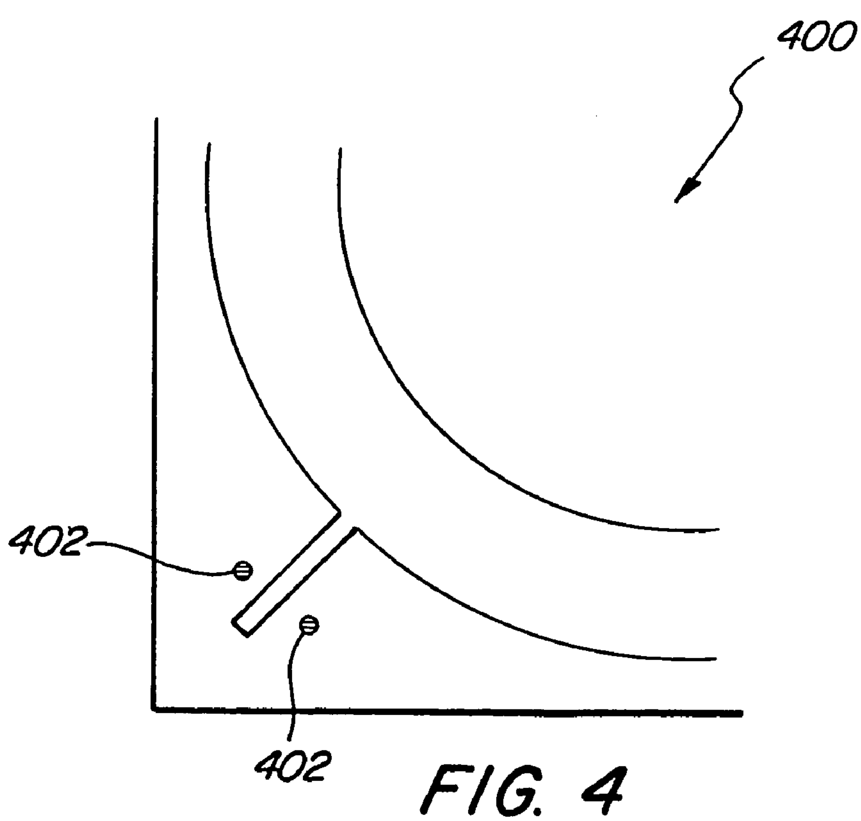
FIG. 4 illustrates a corner portion of a microdevice chip center layer according to one embodiment of the invention.

FIG. 4 illustrates a corner portion of a microdevice chip center layer 400, similar to center layer 202 in FIG. 2, according to one embodiment of the invention. The center layer 400 may be fabricated to include microdevice chips with one or more through-holes or vias 402. Each of these vias 402 functions to position the getter assembly, upon its insertion, until the solder on the getter assembly is melted and flowed. The vias 402 in the center layer 400 may be of a dimension to accommodate the getter assembly in its desired orientation and are positioned so as to align above their respective bond pads 304 on the bottom cover layer 300 for solder attachment. In various embodiments of the invention one or more getters per microdevice chip may be arranged by including one or more vias in the center layer 400. Where mass balance of the microdevice is desired, the vias 402 may be symmetrically placed on each microdevice chip to permit symmetrical distribution of the getters.

In various embodiments of the invention, getters may be made commercially in any size, for instance, from about fifty (50) μm diameter on up. One such type of getter includes sintered, porous non-evaporable zirconium getters which may be obtained in that size range.

Getters can be provided or pre-processed to include a base with a charge of a solder or eutectic mixture. Alternatively, the bond pads 304 on the bottom cover layers 304 can be pre-tinned. The solder is chosen so as to melt at temperature close to or slightly above the temperature chosen for the getter activation. For example, the 55Ge/45Al eutectic (424° C.) or the 82Au/18In solder (485° C. liquidus/451° C. solidus) can be used. It is to be understood that activation of the getter "initiates" at this step.

As a result of the incorporating such getters into a microdevice chip 200, a constant vacuum level is established and maintained within the sealed microdevice chip.

Figure 5:
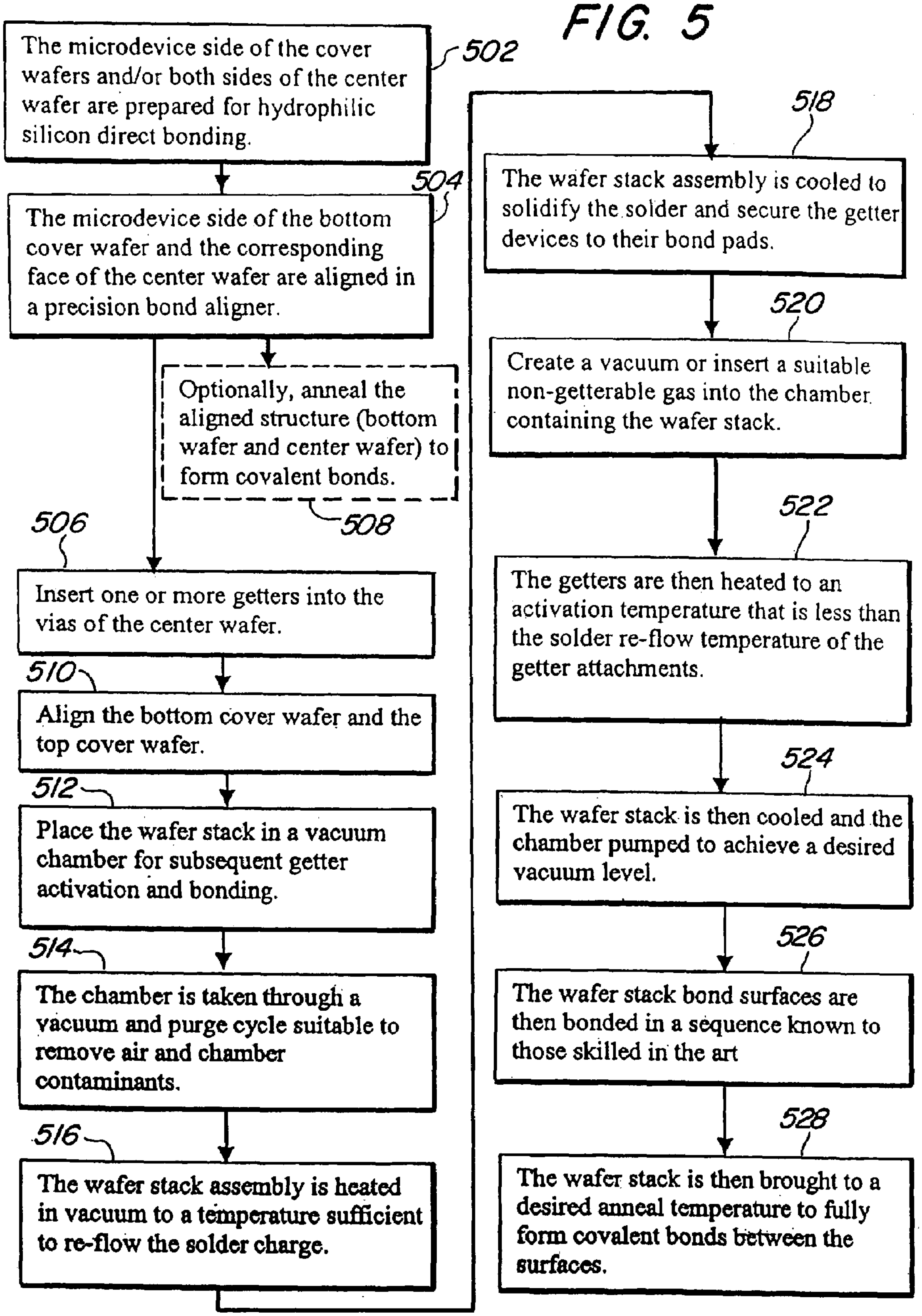
FIG. 5 illustrates a method for inserting getters into hermetically sealed silicon microdevices to maintain the microdevice at a substantially constant vacuum level according to one embodiment of the invention.

FIG. 5 illustrates a method for inserting getters into hermetically sealed silicon microdevices to maintain the microdevice at a substantially constant vacuum level according to one embodiment of the invention.

The microdevice side of the top and bottom cover wafers 104 and 106 and/or both sides of the center wafer 102 are prepared for hydrophilic silicon direct bonding 502. They are prepared in such a manner that the initial Van der Waals bonding and the thermal covalent bonding process can occur within the temperature range of the vacuum bonding equipment being used. This preparation method can be accomplished, for instance, with plasma activation techniques known to those skilled in the art. In one embodiment of the invention, this maximum temperature is approximately 500° C. for the vacuum bonder.

The microdevice side of the bottom cover wafer 106 and the corresponding face of the center wafer are aligned 504 in a precision bond aligner and bonded. When properly aligned, the microdevice chips 200 formed by the wafers 100 have one or more exposed vias 402 in the center wafer 102 for getter insertion to the metal bond pads 304.

Next one or more getters may be immediately inserted into the vias 402 of the center wafer 506. This can be done manually or by means of pick-and-place mechanization. Alternatively, the aligned bottom wafer 106 and center wafer 102 are immediately annealed to form a covalent bond between the two wafers 508 followed by insertion of the one or more getters into the vias. The bond annealing can be carried out at any temperature suitable for bond annealing unless there are charges of solder on the cover wafer 206 bond pads 304. In this case, bond annealing may be carried out below the melting temperature of the charge. Bond annealing the bottom wafer 106 and center wafer 102 allows more time for getter insertion but may require a second surface activation for a subsequent bond of the wafers. The top cover wafer 204 may be activated at this time also.

After getters are inserted in the vias 402 and held by gravity, the bottom cover wafer 206 and the top cover wafer 204 are aligned 510 in the bond aligner in a fixture for vacuum bonding. This fixture for vacuum bonding is comprised of a chuck assembly with flags that are placed between the wafer bond surfaces, holding the two wafers in alignment but separated by a small distance. The wafer stack 100, so clamped, is then moved to a suitable vacuum bonder and placed in a chamber for the subsequent getter activation and bonding steps 512.

The chamber is taken through a vacuum and purge cycle suitable to remove air and chamber contaminants 514. The wafer stack assembly 100 is then heated in vacuum to a temperature sufficient to re-flow the solder charge 516 and then cooled to solidify the solder and secure the getter devices to their bond pads 518.

The next step can take place in vacuum or in a suitable non-getterable gas. Non-getterable gasses, such as argon, can facilitate removal of outgassing products by use of pump and purge cycles 520. The getters are then brought to an activation temperature by heating the chuck assembly which supports the wafer stack to a temperature that is less than the solder re-flow temperature of the getter attachments 522. A temperature of approximately 400° C. is suitable for use with the solder candidates referred to previously.

The chuck assembly and wafer stack 100 are then cooled and the chamber pumped to achieve a desired vacuum level 524. Sufficient time must be allowed to pump and remove outgassing products from the small space between the wafer bond surfaces.

The wafer stack 100 bond surfaces are then bonded 526 in a sequence known to those skilled in the art. This may occur with a wafer-bow formed by a piston applied to the top cover wafer 104 followed by contact and flag release. As a result, the wafer stack 100 is aligned and bonded by Van der Waals forces and/or covalent bonds.

The wafer stack 100 is then brought to a desired anneal temperature to fully form covalent bonds between the surfaces 528. This temperature can be selected in the range not to exceed the re-flow temperature of the getter assembly solder. Further getter activation will occur, with any outgassed material being resorbed upon cooling.

A similar sequence can be performed wherein getters are attached with a drop of low-outgassing epoxy applied at the time of insertion. The epoxy must be able to cure at lower temperature than that employed for getter activation and also withstand said activation temperature. Device lifetime will be reduced in proportion to the amount of non-getterable material outgassed by epoxy.

In various implementations of the invention, gyroscopic devices or any other electronic, electromechanical, and/or storage devices may be sealed in the microelectronic devices under vacuum and with getters as described above.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A method for fabricating a vacuum package comprising:

arranging a bottom cover wafer under a center wafer, the bottom cover wafer including one or more bond pads to receive one or more getters, the center wafer including one or more vias substantially aligned and corresponding to the one or more bond pads;

inserting one or more getters into the one or more vias; and arranging a top cover wafer opposite the bottom cover wafer to sandwich the center wafer in between, the bottom cover wafer, the center wafer, and the top cover wafer forming a wafer stack assembly.

2. The method of claim 1 further comprising:

aligning the bottom cover wafer and the center wafer prior to inserting the one or more getters into the one or more vias.

3. The method of claim 1 further comprising:

aligning the bottom cover wafer and a top cover wafer after inserting the one or more getters into the one or more vias.

4. The method of claim 1 further comprising:

bonding the bottom cover wafer to the center wafer prior to inserting the one or more getters into the one or more vias.

5. The method of claim 1 further comprising:

placing the wafer stack assembly in a vacuum chamber for bonding and getter activation.

6. The method of claim 5 further comprising:

purging the vacuum chamber of air and contaminants prior to heating the wafer stack assembly in a vacuum to a temperature sufficient to re-flow solder on the one or more bond pads.

7. The method of claim 5 further comprising:

purging the vacuum chamber of air and contaminants prior to heating the getters to an activation temperature that is less than the solder re-flow temperature.

8. The method of claim 5 further comprising:

inserting a non-gettable gas into the vacuum chamber prior to heating the getters to an activation temperature that is less than the solder re-flow temperature.

9. The method of claim 5 further comprising:

pumping the vacuum chamber to achieve a desired vacuum level after the getters are heated to an activation temperature that is less than the solder re-flow temperature.

10. The method of claim 1 further comprising:

heating the wafer stack assembly in a vacuum to a temperature sufficient to re-flow solder on one or more bond pads.

11. The method of claim 10 further comprising:

cooling the wafer stack assembly to solidify the solder and secure the one or more getters to the corresponding bond pads.

12. The method of claim 11 further comprising:

heating the getter to an activation temperature that is less than the solder re-flow temperature.

13. The method of claim 12 further comprising:

bonding the bottom cover wafer, center wafer, and top cover wafer together in a vacuum.

14. The method of claim 12 further comprising:

cooling the wafer stack assembly after the getters are heated to an activation temperature that is less than the solder re-flow temperature.

15. The method of claim 13 further comprising:

annealing the wafer stack assembly to a desired anneal temperature to fully form covalent bonds between the bonded surfaces.

16. A method for fabricating a gyroscope microdevice chip comprising:

aligning a bottom cover silicon wafer and a center silicon wafer, the bottom cover silicon wafer including one or more bond pads to receive one or more getters, the center silicon wafer including one or more vias aligned and corresponding to the one or more bond pads, the center silicon wafer also including a gyroscopic device;

inserting one or more getters into the one or more vias; and aligning the bottom cover silicon wafer and a top cover silicon wafer, the bottom cover silicon wafer, center silicon wafer, and top cover silicon wafer forming a wafer stack assembly.

17. The method of claim 16 further comprising:

heating the wafer stack assembly in a vacuum to a temperature sufficient to re-flow solder on one or more bond pads.

18. The method of claim 17 further comprising:

heating the getter to an activation temperature that is less then the solder re-flow temperature.

19. The method of claim 18 further comprising:

placing the wafer stack assembly in a vacuum chamber for bonding and getter activation;

purging the vacuum chamber of air and contaminants prior to heating the wafer stack assembly in a vacuum to a temperature sufficient to re-flow solder on the one or more bond pads;

purging the vacuum chamber of air and contaminants prior to heating the getters to the activation temperature that is less than the solder re-flow temperature;

cooling the wafer stack assembly after the getters are heated to the activation temperature that is less than the solder re-flow temperature; and pumping the vacuum chamber to achieve a desired vacuum level after the getters are heated to the activation temperature that is less than the solder re-flow temperature.

20. The method of claim 19 further comprising:

inserting a non-gettable gas into the vacuum chamber prior to heating the getters to an activation temperature that is less than the solder re-flow temperature.

21. The method of claim 19 further comprising:

bonding the bottom cover wafer, center wafer, and top cover wafer together in a vacuum to form bonds between the bonded surfaces; and annealing the wafer stack assembly to a desired anneal temperature to fully form covalent bonds.

* * * * *